United States Patent
Miettinen et al.

(10) Patent No.: US 6,385,069 B2
(45) Date of Patent: May 7, 2002

(54) FREQUENCY CONVERTER

(75) Inventors: Osmo Miettinen; Jukka Jaskari, both of Vaasa (FI)

(73) Assignee: Vacon Oyj, Vaasa (FI)

( * ) Notice: Subject to any disclaimer, the term of this patent is extended or adjusted under 35 U.S.C. 154(b) by 0 days.

(21) Appl. No.: 09/796,699

(22) Filed: Mar. 2, 2001

(30) Foreign Application Priority Data

Mar. 6, 2000 (FI) ................................................ 2000510

(51) Int. Cl.[7] .......................... H02M 5/00; H01R 13/66
(52) U.S. Cl. ......................... 363/157; 439/1; 439/620; 439/76.1
(58) Field of Search ................................. 363/157, 164, 363/165; 439/1, 76.1, 76.2, 620, 954

(56) References Cited

U.S. PATENT DOCUMENTS 6,129,560 A * 10/2000 Baur et al. .................. 439/76.1
6,171,151 B1 * 1/2001 Lu ............................... 439/620
6,313,449 B1 * 11/2001 Smith et al. ................. 363/157

FOREIGN PATENT DOCUMENTS

JP          6351260 A      12/1994
JP          9247903 A       9/1997

* cited by examiner

*Primary Examiner*—Jessica Han
(74) *Attorney, Agent, or Firm*—Oliff & Berridge, PLC

(57) ABSTRACT

The present invention relates to a frequency converter comprising a power part and a control and adjustment part. The frequency converter is characterized in that the control and adjustment part is arranged to be a separate control and adjustment unit separated from the power part and in that the control and adjustment unit forming the control and adjustment part is arranged to be connected to the power part by a telecommunication unit. The telecommunication unit is a wired optic connection or a wireless connection, the control and adjustment part and the power part then being galvanically separated.

11 Claims, 5 Drawing Sheets

FREQUENCY CONVERTER

FIELD OF THE INVENTION

The invention relates to a frequency converter.

BACKGROUND OF THE INVENTION

A frequency converter is a device for steplessly adjusting the rotation speed of an alternating-current motor, such as a short circuit motor. The rotation speed is adjusted in the frequency converter mainly by converting the voltage supplied to the motor and the frequency of the voltage. The frequency converter can be used for adjusting the acceleration and deceleration as well as braking and reversing of the motor. When the frequency converter is used for controlling the motor, the motor can be controlled and adjusted from a control unit by a computer.

In view of the characteristics mentioned above, frequency converters have become increasingly popular particularly in industrial uses associated with different processes. An alternating-current motor controlled and adjusted by a frequency converter currently often replaces a direct-current motor in industrial processes. The frequency converter is typically used for controlling electric motors for pumps, blowers, elevators, hoists, conveyors etc. Frequency converters are also increasingly being used in smaller applications, such as household appliances.

Frequency converters can be widely applied since electric motors are used in devices of many different types. Such a typical device to employ a steplessly controlled electric motor is an elevator for conveying persons or goods. The electric motor moving the elevator has thus to be operationally flexible in order to move the elevator between loading and unloading planes, accelerate and brake smoothly as well as position accurately between the loading and unloading planes. Elevators come in various sizes according to use. Elevators are also used in different environments, which means that humidity and temperature conditions vary greatly. Frequency converters of different capacity and type can then preferably be used for controlling the motors for elevators of varying sizes.

A problem with the current frequency converters is that a frequency converter suitable for controlling a motor of a particular capacity, such as a 0.75 kW motor, is a compact device wherein all structural components of the frequency converter are arranged in one and the same casing. The frequency converter mainly comprises a power part comprising means for converting alternating current into direct current and again into alternating current having an adjustable frequency, and a control and adjustment part comprising means for controlling and adjusting the operation of the power part and thus the operation of the electric motor. Additionally, according to the prior art, the control and adjustment part comprises a mother card and IO-cards (Input/Output), the IO-cards being arranged in parallel with the mother board, i.e. horizontally and on top of each other.

Such a compact frequency converter is problematic since different applications, such as different elevators, require a great number of different frequency converters designed for different uses. This results in a large range of frequency converters which is difficult to manage and uneconomic to maintain. On the other hand, as frequency converters are increasingly being used in different applications, more and more adaptable frequency converters are needed constantly.

A major problem with the prior art solutions is thus that the frequency converters are complex and hence uneconomic to arrange in different applications and environments. The problem is mainly caused by the structure of the prior art frequency converters wherein all structural components of the device are arranged in the same casing and the IO-cards of the control and adjustment part are arranged in parallel with the mother card, i.e. horizontally, and on top of each other.

BRIEF DESCRIPTION OF THE INVENTION

An object of the present invention is to alleviate drawbacks of the prior art and to provide an improved frequency converter whose structure enables the frequency converter to be more flexibly and more advantageously arranged in different applications of varying requirements.

This is achieved by a frequency converter of the invention characterized by what is disclosed in the claims. To be more precise, the frequency converter of the invention is mainly characterized by what is disclosed in the characterizing part of claim 1.

Preferred embodiments of the invention are disclosed in the dependent claims.

The idea underlying the invention is that the power part and the control and adjustment part of the frequency converter are separated from each other, and the control and adjustment part is arranged as a separate control and adjustment unit of its own which is independent of the power part and which is preferably arranged in a separate casing or module. This solution provides several important advantages.

Since the structural components of the frequency converter are not arranged in the same casing but they are divided into two separate units, the important advantage achieved is that the features of a frequency converter using a power part of a particular capacity can be varied according to different applications by changing the control and adjustment part. The features of the control and adjustment part are arranged according to the different applications by varying the software and the mother card and IO-cards (Input/Output) of the control and adjustment part. The software in the control and adjustment part controls the operation of the power electronics in the power part of the frequency converter by means of measurement and adjustment messages received and transmitted through the IO-cards. Considerable advantages in terms of product differentiation of the frequency converter are thus achieved as regards enhancing the product range and cost-efficiency. A control and adjustment part having certain features can then be used with a power part of several power capacities; similarly, several different control and adjustment parts can be used with a power part having a certain capacity.

Dividing the power part and the control and adjustment part into two separate units substantially improves the possibilities of enhancing interference protection in the power part as well as in the control and adjustment part. The power part can then be encapsulated efficiently in order to improve the electromagnetic EMC protection. The power part of the frequency converter typically emits a large amount of electromagnetic interference radiation (EMC) into the environment, which impedes the operation of electronic devices. Secondly, arranging the control and adjustment part in a separate unit enables the electronics in the control and adjustment part to be advantageously protected, by encapsulation, against the electromagnetic interference radiation coming from outside.

Furthermore, dividing the power part and the control and adjustment part into two separate units substantially improves the possibilities to protect, by encapsulation, the power part as well as the control and adjustment part against damp, dust and gases in the environment as well as stress caused by other environmental factors. In addition, dividing the power part and the control and adjustment part into two separate units improves work safety during installation since the high voltage structural components of the frequency converter can be efficiently shielded from contact by encapsulating the power part as well as the control and adjustment part.

As an advantage associated with the manufacture and testing, dividing the power part and the control and adjustment part into two separate units enables the power part to be manufactured and tested independently of the control and adjustment part and, similarly, the control and adjustment part to be manufactured and tested independently of the power part. The parts can then preferably be manufactured and tested separately and in different places. A further advantage is that the final assembly of the frequency converter, i.e. interconnecting the power part and the control and adjustment part, does not have to be carried out until on the customer's premises or in the delivery country, which is commercially and technically advantageous.

The control and adjustment part and the power part are interconnected by a telecommunication connection. The telecommunication connection is preferably a wired connection or a wireless one. The great advantage achieved is that the control and adjustment part and the power part can then be efficiently galvanically separated, which makes the control and adjustment part better protected against electromagnetic interference. If the telecommunication connection is a wired connection, it is preferably implemented using an optic wire. Another preferred way to implement the telecommunication connection is to use wireless data transmission based on a radio link.

The control and adjustment part of the frequency converter further comprises a mother card and IO-cards. The IO cards are preferably arranged substantially vertically with respect to the mother card such that a substantially right angle is provided between the mother card and an IO-card. It is then much simpler and quicker to install and change the IO-cards. Additionally, arranging the IO-cards vertically instead of the conventional horizontal position substantially improves the IO-card packing density.

BRIEF DESCRIPTION OF THE DRAWINGS

In the following, the invention will be described in closer detail by means of the accompanying drawings, in which.

DETAILED DESCRIPTION OF THE INVENTION

Referring to FIGS. 1 to 5, an example of the structure of a typical frequency converter of the invention will be described.

A frequency converter 1 typically comprises a power part 2 comprising means for converting alternating current into direct current and again to alternating current having an adjustable frequency, and a control and adjustment part 3 comprising means for controlling and adjusting the operation of the power part 2. The frequency converter 1 is used for controlling the operation of an electric motor, i.e. typically the operation of a short circuit motor. Control signals supplied to the power part 2 by the control and adjustment part 3 of the frequency converter 1 then indirectly affect the operation of the electric motor controlled by the frequency converter 1.

Figure 1:
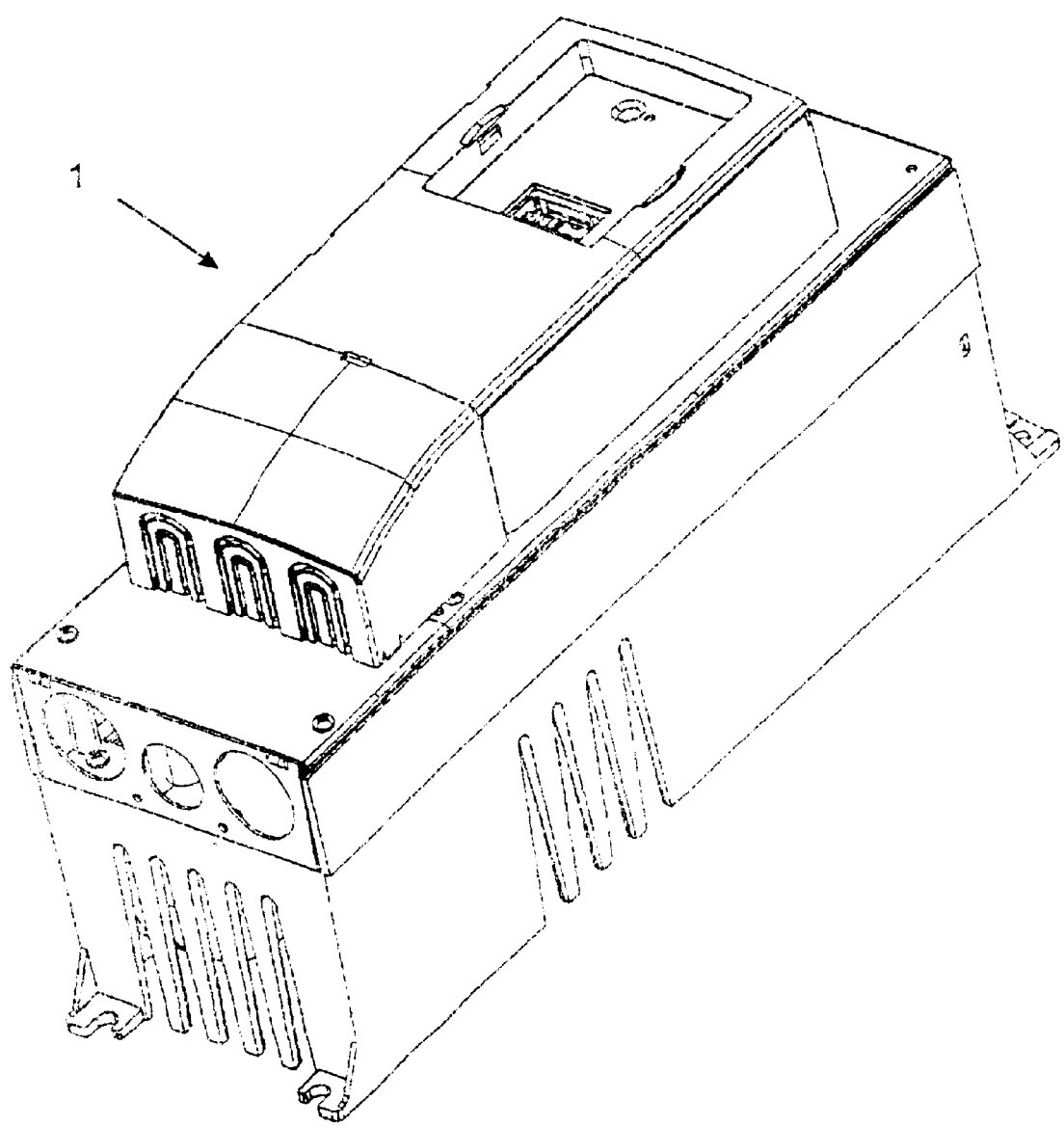
FIG. 1 shows a frequency converter according to the invention.
Figure 2:
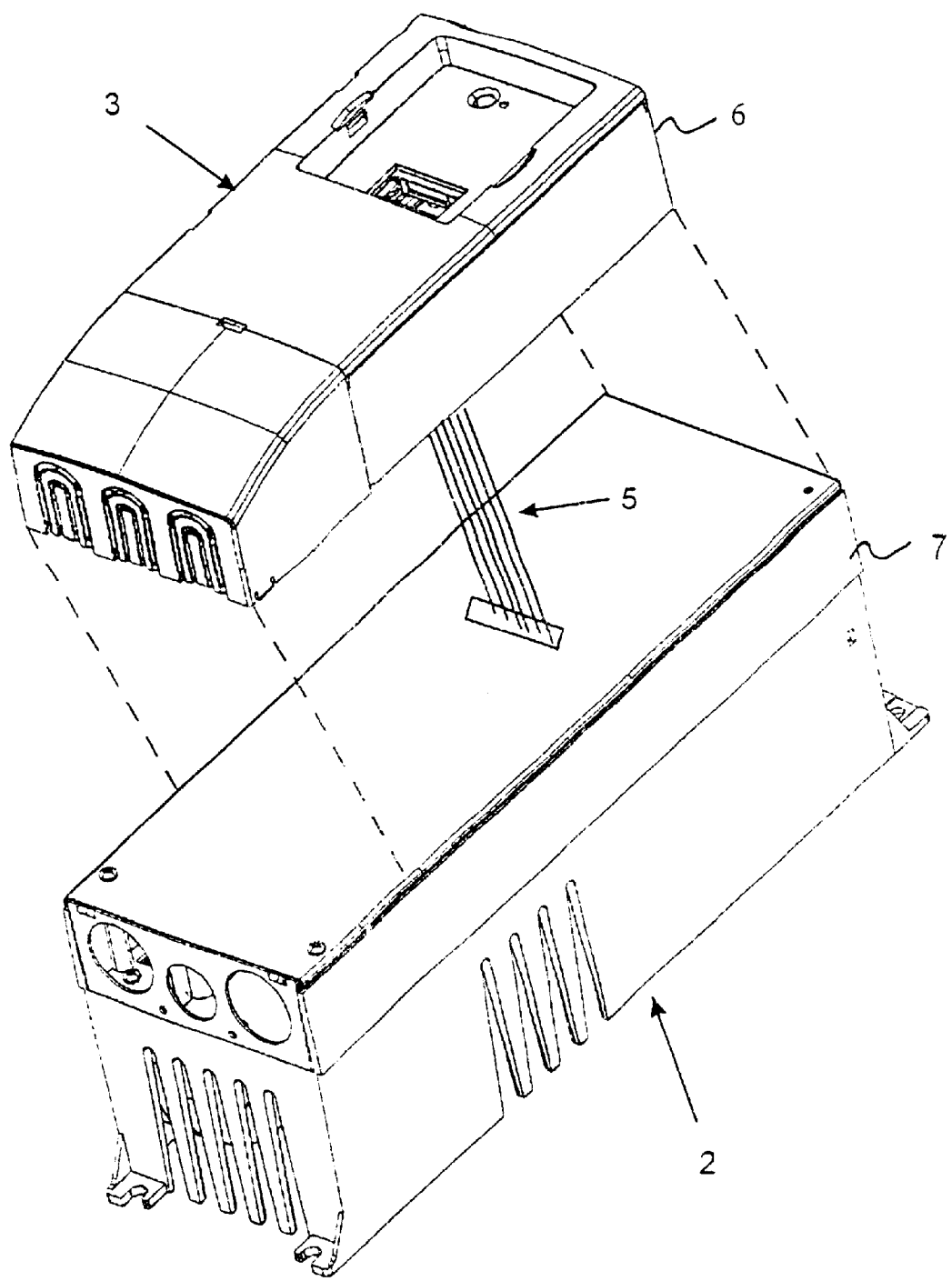
FIG. 2 shows the frequency converter of FIG. 1 wherein a power part and a control and adjustment part are separated from each other.

The embodiment of FIG. 2 shows that the power part 2 and the control and adjustment part 3 of the frequency converter 1 are separated from each other. The control and adjustment part 3 is separated into a separate control and adjustment unit 4 of its own which is independent of the power part 2; this is shown more clearly in FIGS. 3 to 5. FIG. 2 further shows that the power part 2 also forms a separate power unit 2 of its own.

FIG. 2 shows that the control and adjustment part 3 and the power part 2 are interconnected by a telecommunication connection 5. The telecommunication connection 5 is either a wired connection or a wireless one. A suitable alternative is chosen according to the application.

The structural components of the frequency converter 1, i.e. the power part 2 and the control and adjustment part 3, are arranged and encapsulated in separate casings 6, 7. The encapsulation in the separate casings 6, 7 enables the power part 2 as well as the control and adjustment part 3 to be flexibly protected against damp, dust, gases and stress caused by other environmental factors. The protection rating required from the power part 2 is IP54, according to the IP-standard. Dividing the power part 2 and the control and adjustment part 3 into two separate units and into separate casings 6, 7 improves work safety during installation since the high voltage structural components of the frequency converter can be efficiently shielded by encapsulating the power part 2 as well as the control and adjustment part 3. In addition, in applications wherein the cooling of the power part 2 has to be more efficient than the common air cooling, the cooling of the separate power part 2 thus implemented can be carried out using liquid or gas, which is more efficient in cooling than air.

Dividing the power part 2 and the control and adjustment part 3 into two separate units and encapsulating them in the separate casings 6, 7 enable the protection of the power part 2 as well as the control and adjustment part 3 against interference to be improved. The power part 2 is encapsulated by a closed metal cover and the protective sheaths of the wire are grounded at lead-through points in order to achieve electromagnetic EMC protection. Similarly, arranging the control and adjustment part 3 of the frequency converter 1 in the separate unit 4 enables the electronics in the control and adjustment part 3 to be protected against electromagnetic radiation coming from outside by encapsulation in a closed metal cover and by grounding the protective sheaths of the wire at lead-through points.

Figure 4:
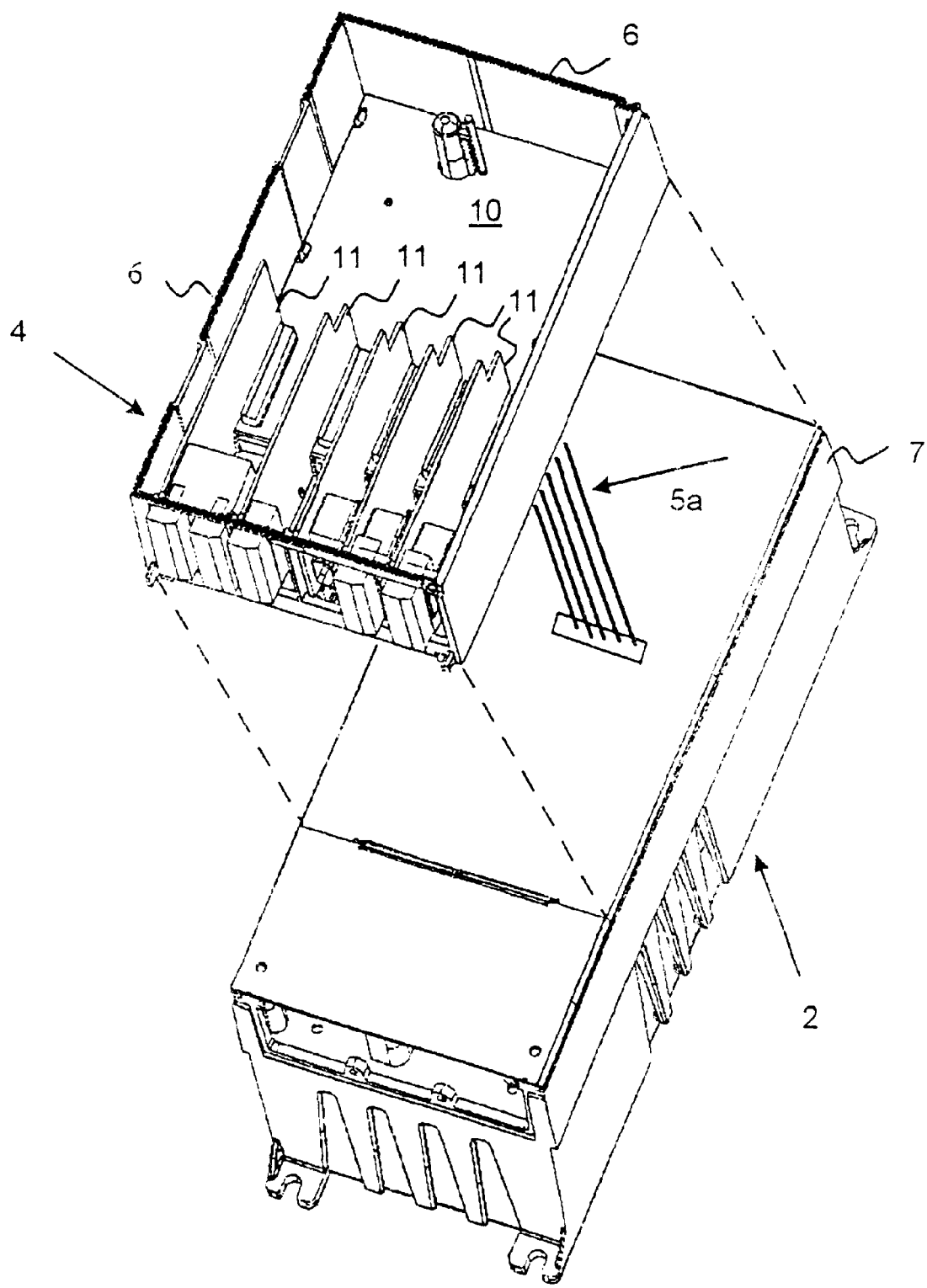
FIG. 4 shows the frequency converter of FIG. 3 wherein the power part and the control and adjustment part are separated from each other and interconnected by a telecommunication connection comprising an optic wire.
Figure 5:
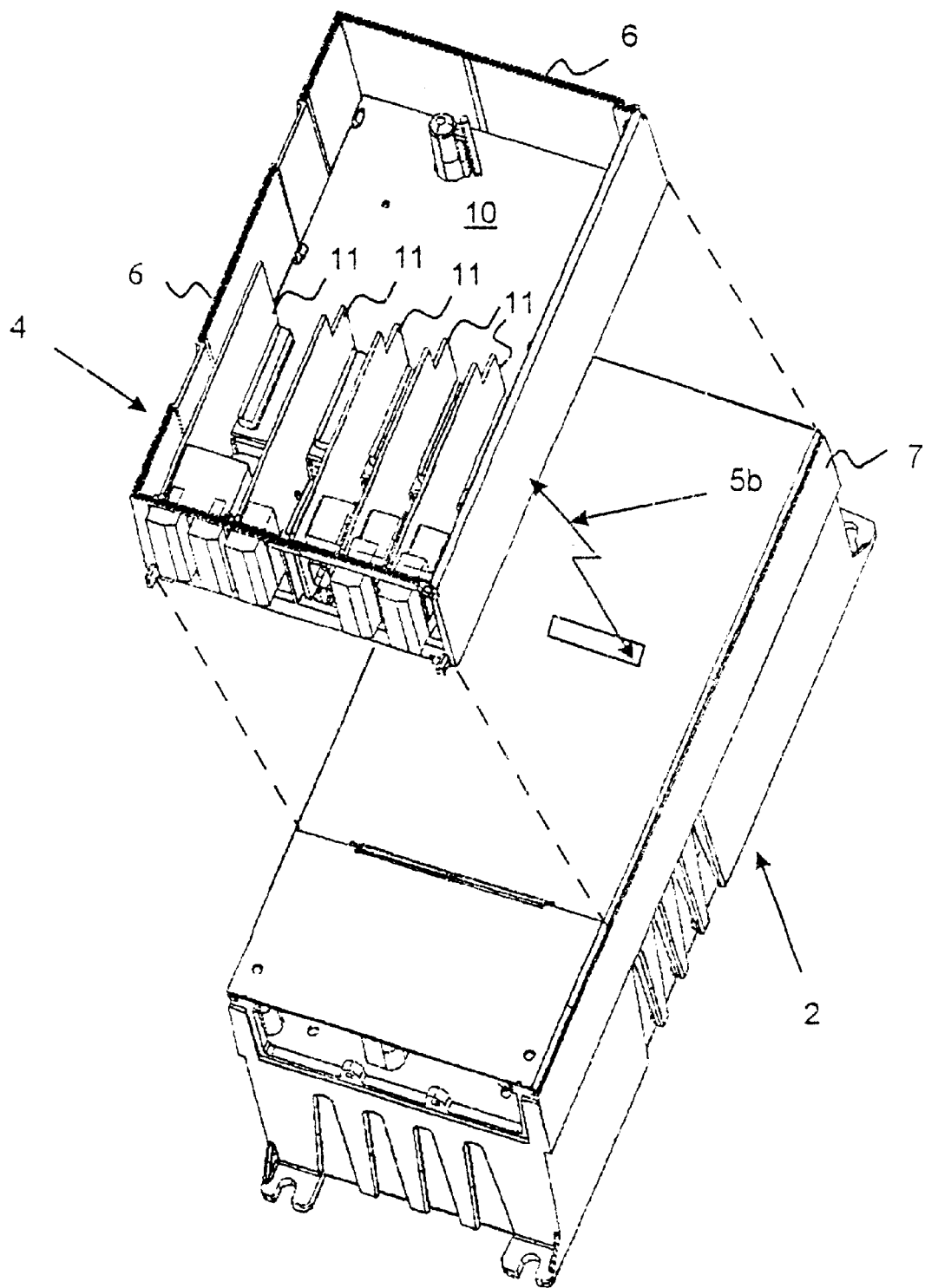
FIG. 5 shows the frequency converter of FIG. 3 wherein the power part and the control and adjustment part are separated from each other and interconnected by a wireless telecommunication connection.

As shown by the embodiments in FIGS. 2, 4 and 5, the frequency converter 1 divided into two separate units and comprising the power part 2 of a certain capacity can be varied according to different applications by simply changing the control and adjustment part 3. The control and adjustment part 3 is changed by first detaching the casing 6 comprising the control and adjustment part 3 and disconnecting the telecommunication connection 5, after which a new telecommunication connection 5 is connected and the casing 6 comprising the control and adjustment part 3 is attached to the casing 7 comprising the power part 2.

The features of the control and adjustment part 3 are arranged according to different applications by varying the software and IO-cards 11 (Input/Output) of the control and adjustment part 3. The software of the control and adjustment part 3 controls the operation of the power electronics in the power part 2 of the frequency converter 1 by means of measurement and adjustment messages received and transmitted through the IO-cards 11. The measurement messages received through the IO-cards 11 are typically current signals or voltage signals that are used for conveying information to the control and adjustment part 3 of the frequency converter 1 about different measurement variables, such as temperatures, humidity, flow or rotation rates, device currents, voltages, frequencies or the like. Similarly, the control and adjustment messages transmitted from the IO-cards 11 are typically current signals or voltage signals that are used for controlling the operation of the power part 2 of the frequency converter 1 or devices around the frequency converter.

Figure 3:
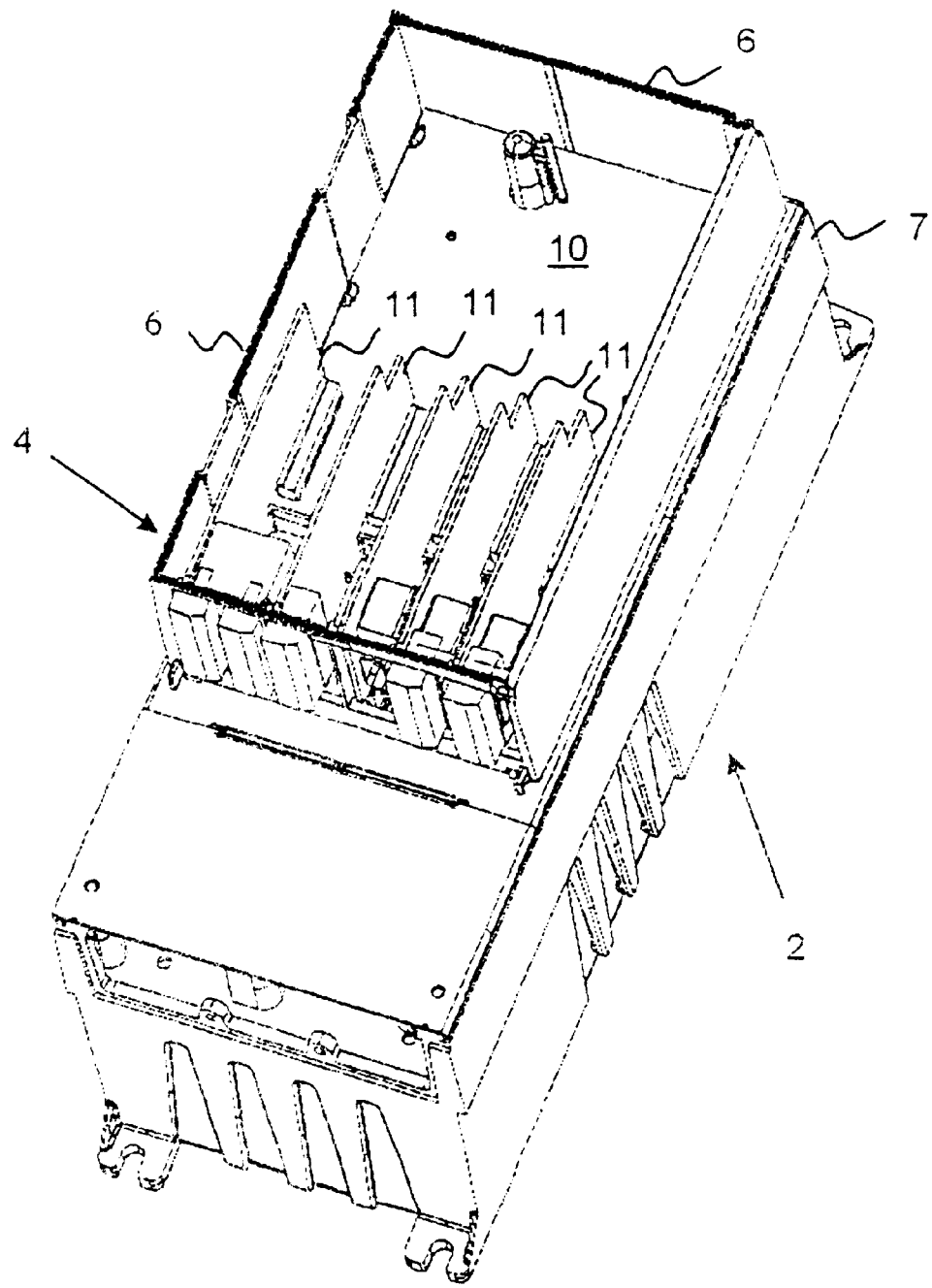
FIG. 3 shows the frequency converter of FIG. 1 with a protective casing of the control and adjustment part being opened.

In the embodiment of FIG. 3, the control and adjustment unit 4 of the frequency converter 1 comprises a mother card 10 and IO-cards 11. In the frequency converter 1 of the invention, the IO-cards 11 are arranged substantially vertically with respect to the mother card 10. A substantially right angle is then provided between the mother card 10 and an IO-card 11. The mother card 10 is provided with connectors whereto the IO-cards 11 are pushed and fastened. Placing the IO-cards 11 vertically with respect to the mother card 10 significantly simplifies and quickens the installation and exchange of the IO-cards, which enables the IO-card combination of the control and adjustment part to be appropriately varied in a fast and simple manner. Arranging the IO-cards 11 vertically enables the packing density of the IO-cards 11 to be improved in comparison to a horizontal arrangement.

In the embodiment of FIG. 2, the control and adjustment part 3 as well as the power part 2 of the frequency converter 1 are interconnected by the telecommunication connection 5. Through the telecommunication connection 5, the control and adjustment part 3 transmits the control signals to the power part 2. The telecommunication connection 5 is a wired or a wireless connection. When the telecommunication connection 5 is used for interconnecting the control and adjustment part 3 and the power part 2, the distance between control and adjustment part 3 and the power part 2 may be chosen relatively freely. The control and adjustment part 3 does not then have to be located in the immediate vicinity of the power part 2 but it can be located e.g. in a main cabinet.

In the embodiment of FIG. 4, the control and adjustment part 3 as well as the power part 2 of the frequency converter 1 are interconnected by a telecommunication connection 5, which is a wired connection 5*a*. It is important to separate the control and adjustment part 3 and the power part 2 galvanically from each other. An optic wire is then used. When the control and adjustment part 3 and the power part 2 are galvanically separated, the protection of the control and adjustment part 3 against electromagnetic interference and fault currents and voltages transmitted by the galvanic connection is improved.

In the embodiment of FIG. 5, the control and adjustment part 3 as well as the power part 2 of the frequency converter 1 are interconnected by a telecommunication connection 5, which is a wireless connection 5*b*. When the wireless telecommunication connection 5*b* is used, the control and adjustment part 3 and the power part 2 are galvanically separated from each other. This enables good protection of the control and adjustment part 3 against electromagnetic interference and fault currents and voltages transmitted by the galvanic connection. In addition, the location of the control and adjustment part 3 can be freely chosen with respect to the power part 2 within the scope of the coverage area of the wireless telecommunication connection 5*b*.

In the embodiment of FIG. 5, the wireless telecommunication connection 5*b* between the control and adjustment part 3 and the power part 2 of the frequency converter 1 is typically a radio link. The technology used for implementing the radio link can vary greatly depending on the connection distance between the control and adjustment part 3 and the power part 2. At short distances, a radio link e.g. according to technology called Bluetooth may be used.

The wireless telecommunication connection 5 between the control and adjustment part 3 and the power part 2 of the frequency converter 1 is typically a field bus connection, such as CAN, Profibus, LONworks, serial traffic connection, such as RS-232 or the like. The technology used for implementing the telecommunication connection 5 and the data transmission protocol used may, however, be in accordance with technology suited for several such uses and environments.

Dividing the power part 2 and the control and adjustment part 3 into two separate units while manufacturing and testing the frequency converter enables the power part 2 as well as the control and adjustment part 3 to be manufactured and tested independently, irrespective of each other. The parts may then preferably be manufactured and tested separately and in different locations. The final assembly of the frequency converter, i.e. interconnecting the power part 2 and the control and adjustment part 3, does not have to be carried out until on the customer's premises in connection with delivery or in the delivery country.

It is to be understood that the above description and the related drawings are only intended to illustrate the present invention. The invention is thus not restricted to the embodiment disclosed above or defined in the claims but it is obvious to one skilled in the art that the invention can be varied and modified in many ways within the scope of the inventive idea disclosed in the attached claims.

What is claimed is:

1. A frequency converter comprising:
   a power part of the frequency converter comprising means for converting alternating current into direct and again to alternating current having adjustable voltage and frequency,
   a control and adjustment part of the frequency converter comprising means for controlling and adjusting the operations of the power part,
   wherein
   the control and adjustment part is arranged to be a separate control and adjustment unit separated from the power part, wherein the control and adjustment unit forming the control and adjustment part is coupled to the power part by a telecommunications connection so that the control and adjustment unit can communicate with the power part through the telecommunications connection while the control and adjustment unit is separated from the power part.

2. A frequency converter as claimed in claim 1, wherein the control and adjustment unit comprises a mother card and IO-cards, the IO-cards being arranged substantially vertically with respect to the mother card such that at least approximately a right angle is provided between the mother card and an IO-card.

3. A frequency converter as claimed in claim 1, wherein the telecommunications connection is a wired connection.

4. A frequency converter as claimed in claim 3, wherein the telecommunication connection between the control and adjustment unit and the power part is an optic connection.

5. A frequency converter as claimed in claim 1, wherein the telecommunication connection is a wireless telecommunication connection.

6. A frequency converter as claimed in claim 1, wherein the telecommunication connection is a field bus connection. claims, characterized in that the telecommunication connection is a field bus connection.

7. A frequency converter as claimed in claim 1, wherein the telecommunication connection is a serial traffic connection.

8. A frequency converter as claimed in claim 1, wherein the control and adjustment unit is galvanically separated from the power part.

9. A frequency converter as claimed in claim 1, wherein the control and adjustment part comprising the control and adjustment unit is arranged in a casing.

10. A frequency converter as claimed in claim 9, wherein the casing comprising the control and adjustment part is arranged to form a protective structure around the control and adjustment part against electromagnetic radiation.

11. A frequency converter as claimed in claim 9, wherein the casing comprising the control and adjustment part is arranged to form an impermeable protective structure around the control and adjustment unit against damp, dust, gas or such an environmental factor.

* * * * *

UNITED STATES PATENT AND TRADEMARK OFFICE
CERTIFICATE OF CORRECTION

PATENT NO. : 6,385,069 B2
DATED : May 7, 2002
INVENTOR(S) : Osmo Miettinen et al.

It is certified that error appears in the above-identified patent and that said Letters Patent is hereby corrected as shown below:

<u>Title page,</u>
Item [30], Foreign Application Priority Data, change "2000510" to
-- 20000510 --.

Signed and Sealed this

Twenty-ninth Day of October, 2002

*Attest:*

*Attesting Officer*

JAMES E. ROGAN
*Director of the United States Patent and Trademark Office*